(12) United States Patent
Taguchi et al.

(10) Patent No.: US 8,519,063 B2
(45) Date of Patent: *Aug. 27, 2013

(54) UNDERFILL COMPOSITION AND AN OPTICAL SEMICONDUCTOR DEVICE

(75) Inventors: Yusuke Taguchi, Annaka (JP); Junichi Sawada, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 49 days.

This patent is subject to a terminal disclaimer.

(21) Appl. No.: 12/875,606

(22) Filed: Sep. 3, 2010

(65) Prior Publication Data

US 2011/0065872 A1   Mar. 17, 2011

(30) Foreign Application Priority Data

Sep. 15, 2009   (JP) .................................. 2009-213778

(51) Int. Cl.
*C08F 283/12* (2006.01)
*C08G 77/16* (2006.01)
*C08G 77/44* (2006.01)

(52) U.S. Cl.
USPC .......................................... 525/477; 525/474

(58) Field of Classification Search
USPC ......................................................... 525/477
See application file for complete search history.

(56) References Cited

U.S. PATENT DOCUMENTS

| | | | |
|---|---|---|---|
| 4,102,970 A * | 7/1978 | Deubzer et al. ............ | 264/176.1 |
| 6,605,360 B2 * | 8/2003 | Kizaki et al. ................... | 428/447 |
| 7,029,754 B2 * | 4/2006 | Yamamoto et al. ........... | 428/447 |
| 7,105,614 B2 * | 9/2006 | Morita et al. ................... | 525/393 |
| 7,973,121 B2 * | 7/2011 | Chaussade et al. ............. | 528/34 |
| 8,022,137 B2 * | 9/2011 | Taguchi et al. ................ | 524/588 |
| 8,193,269 B2 * | 6/2012 | Taguchi et al. ................ | 524/430 |
| 2003/0069349 A1 * | 4/2003 | Sumita et al. .................. | 524/588 |
| 2004/0014843 A1 * | 1/2004 | Sumita et al. .................. | 523/400 |
| 2006/0173126 A1 * | 8/2006 | Araki ............................. | 524/588 |
| 2006/0229408 A1 | 10/2006 | Shimizu et al. | |
| 2010/0029887 A1 * | 2/2010 | Hamamoto et al. ............ | 528/12 |
| 2010/0081748 A1 * | 4/2010 | Taguchi et al. ................ | 524/433 |
| 2010/0273927 A1 * | 10/2010 | Taguchi et al. ................ | 524/433 |

FOREIGN PATENT DOCUMENTS

| | | |
|---|---|---|
| EP | 2 174 984 A1 | 4/2010 |
| JP | 2005-306952 A | 11/2005 |
| JP | 2007-169445 A | 7/2007 |
| JP | 2009-155405 A | 7/2009 |
| JP | 2009-173744 A | 8/2009 |

OTHER PUBLICATIONS

Noll, Walter. Chemistry and Technology of Silicones. Academic Press, New York, 1968. Table 38 p. 269. Evidentiary reference.*
Extended European Search Report issued Oct. 20, 2010, in European Patent Application No. 10176334.

* cited by examiner

*Primary Examiner* — Mike M Dollinger
(74) *Attorney, Agent, or Firm* — Birch, Stewart, Kolasch & Birch, LLP

(57) ABSTRACT

A purpose of the present invention is to provide an underfill composition for optical semiconductor devices which can provide a cured product whose moldability, adhesiveness to a gold bump, heat-resistance, and light resistance are better. The present invention is an underfill composition, comprising (A) 60 to 99 parts by weight of a branched organopolysiloxane having a weight average molecular weight of from 500 to 20000, reduced to polystyrene, and represented by the average compositional formula (1); (B) 250 to 1000 parts by weight of an inorganic filler; (C) 0.01 to 10 parts by weight of a condensation catalyst; (D) 1 to 40 parts by weight of an organopolysiloxane having a linear diorganopolysiloxane moiety, represented by the formula (2), provided that a total amount of component (A) and component (D) is 100 parts by weight; and (E) 0.2 to 2.0 parts by weight of silane coupling agent.

7 Claims, No Drawings

UNDERFILL COMPOSITION AND AN OPTICAL SEMICONDUCTOR DEVICE

CROSS REFERENCE

This application claims the benefits of Japanese Patent Application No. 2009-213778 filed on Sep. 15, 2009, the contents of which are herein incorporated by reference.

FIELD OF THE INVENTION

The present invention relates to an underfill composition for an optical semiconductor device which is formed by attaching an optical semiconductor element to a substrate via a gold bump, wherein the underfill composition is poured and filled into an interstice between the optical semiconductor element and the substrate. More specifically the present invention relates to an underfill composition has good moldability, adhesiveness to a gold bump, heat resistance, and light resistance.

BACKGROUND OF THE INVENTION

Optical semiconductor elements, such as light emitting diodes (LED), are used as indicators or light sources. Recently, their outputs have become higher and their wavelengths have been shorter, which causes a problem that resin materials present near the optical semiconductor elements are degraded due to light. Further, in a case where a material having a glass transition temperature which is above room temperature and below the reflow temperature is used as an underfill composition, such a problem occurs that a chip warpage occurs in a reflow process.

The following Patent Literatures 1 to 3 disclose, underfill resin compositions which are epoxy resin compositions comprising an epoxy resin, a curing agent, and a curing promoter, where a bisphenol A epoxy resin or bisphenol F epoxy resin is used as the epoxy resin. However, when the epoxy resin composition mainly comprising these epoxy resins is used as an underfill composition in an optical semiconductor device, such a problem occurs that an encapsulating resin is degraded to become yellow due to lighting of the optical semiconductor elements for a long time, which luminance significantly lowers.

Patent Literature 4 discloses a composition which comprises an epoxy resin derived from isocyanuric acid, as a heat-resistant and light-resistant epoxy resin composition for encapsulating light emitting elements. However, light resistance of the composition is insufficient, too.

Meanwhile, recently, sizes of molded package have become bigger, for instance, in Matrix Array Package (MAP) method and, therefore, warpage which takes place in curing of an encapsulating resin is a serious problem. Large warpage causes various problems in a package transfer step and a package cutting step. The afore-mentioned compositions are unsatisfactory also in this respect.

Patent Literature 1: Japanese Patent Application Laid-Open No. 2007-169445
Patent Literature 2: Japanese Patent Application Laid-Open No. 2009-155405
Patent Literature 3: Japanese Patent Application Laid-Open No. 2009-173744
Patent Literature 4: Japanese Patent Application Laid-Open No. 2005-306952

SUMMARY OF THE INVENTION

Problems to be Solved by the Invention

A purpose of the present invention is to provide an underfill composition for an optical semiconductor device, which provides a cured product, has no adverse effect on a warpage behavior in a reflow process, better heat resistance and light resistance, and such adhesiveness to a gold bump as equal to or better than that of the previous underfill compositions.

Means to Solve the Problems

The present invention is an underfill composition, comprising
(A) 60 to 99 parts by weight of a branched organopolysiloxane having a weight average molecular weight of from 500 to 20000, reduced to polystyrene, and represented by the following average compositional formula (1),

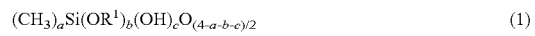

$$(CH_3)_a Si(OR^1)_b (OH)_c O_{(4-a-b-c)/2} \qquad (1)$$

wherein $R^1$ is an organic group having 1 to 4 carbon atoms and a, b, and c are numbers satisfying the equations: $0.8 \leq a \leq 1.5$, $0 \leq b \leq 0.3$, $0.001 \leq c \leq 0.5$, and $0.801 \leq a+b+c < 2$,
(B) 250 to 1000 parts by weight of an inorganic filler,
(C) 0.01 to 10 parts by weight of a condensation catalyst,
(D) 1 to 40 parts by weight of an organopolysiloxane having a linear diorganopolysiloxane moiety represented by the following formula (2),

wherein $R^2$ and $R^3$ are, independently of each other, selected from the group consisting of a hydroxyl group, alkyl groups having 1 to 3 carbon atoms, a cyclohexyl group, a vinyl group, a phenyl group and an allyl group, and m is an integer of from 5 to 50,
provided that a total amount of component (A) and component (D) is 100 parts by weight, and
(E) 0.2 to 2.0 parts by weight of a silane coupling agent.

Effects of the Invention

The composition of the present invention has good moldability and shows less warpage after cured, and a cured product shows better heat resistance and light resistance, on account of the combination of organopolysiloxane (D) which has a linear diorganopolysiloxane moiety having a particular length and organopolysiloxane (A) which has the branched structure.

BEST MODES OF THE INVENTION

(A) Organopolysiloxane

The branched organopolysiloxane (A) has a silanol group and forms a cross-linked structure by a condensation with each other and/or with component (D) in the presence of condensation catalyst (C). In the afore-mentioned average compositional formula (1), $R^1$ is an organic group having 1 to 4 carbon atoms and a, b, and c are numbers which satisfy the equations: $0.8 \le a \le 1.5$, $0 \le b \le 0.3$, $0.001 \le c \le 0.5$, and $0.801 \le a+b+c < 2$.

A composition where "a" representing a content of $CH_3$ is less than the afore-mentioned lower limit gives a too hard cured product, which may crack. If "a" exceeds the afore-mentioned upper limit, such a resin does not solidify. Preferably, "a" satisfies the equation $0.9 \le a \le 1.2$, more preferably $0.9 \le a \le 1.1$.

If b representing a content of $OR^1$ exceeds the afore-mentioned upper limit, the molecular weight is so small that the crack resistance may be insufficient. Preferably, b satisfies the equation $0.001 \le b \le 0.2$, more preferably $0.01 \le b \le 0.1$. The group, $OR^1$, can be quantified in infrared absorption spectra (IR) or alcohol quantification by alkali cracking.

If c, content of an OH group bound to an Si atom, exceeds the afore-mentioned upper limit, such an organopolysiloxane gives, after condensation in thermal curing and/or condensation with component (D), a cured product which has a high stiffness, but shows poor crack resistance. If c is less than the afore-mentioned lower limit, a melting point of the organopolysiloxane tends to be higher, so that problems may occur in molding workability. If no bond is formed between component (A) and (D), components (A) is not fixed in a cured product, so that stiffness of the cured product tends to be lower and solvent resistance tends to be bad. Preferably, c satisfies the equation, $0.01 \le c \le 0.3$, more preferably, $0.05 \le c \le 0.2$. As conditions for controlling c, a complete condensation ratio of the alkoxy groups of the raw materials is preferably from 86% to 96%. If the ratio is less than 86%, a melting point tends to be low, whereas if it exceeds 96%, a melting point tends to be too high.

Accordingly, a total of a, b, and c preferably satisfies the equation, $0.911 \le a+b+c \le 1.8$, more preferably $1.0 \le a+b+c \le 1.5$.

In the above-described average compositional formula (1), $R^1$ may be same with or different from each other and is an organic group having 1 to 4 carbon atoms. Examples of $R^1$ include alkyl groups such as a methyl group, an ethyl group, an isopropyl group, and a n-butyl group; and alkenyl groups such as a vinyl group and an allyl group. A methyl group and an isopropyl group are preferred because such a raw material is easily available.

Organopolysiloxane (A) has a weight average molecular weight of from 500 to 20000, preferably from 1000 to 10000, more preferably from 2000 to 8000, reduced to polystyrene, as determined by GPC. If the molecular weight is less than the afore-mentioned lower limit, such an organopolysiloxane is difficult to solidify. If the molecular weight exceeds the afore-mentioned upper limit, a viscosity is so high that flowability may be too much lower.

Component (A) can generally be represented by the combination of unit Q ($SiO_{4/2}$), unit T ($CH_3SiO_{3/2}$), and unit D [$(CH_3)_2SiO_{2/2}$], and has branched structure. In this notation for component (A), a molar ratio of unit T is preferably 70 mole % or higher, desirably 75 mole % or higher, particularly 80 mole % or higher, relative to the total moles of all of the siloxane units. If the molar ratio of unit T is less than 70%, overall balance among the stiffness, adhesion, and appearance may be worse. The remaining part other than unit T may be units D and Q. These units may preferably account for 30 mole % or less. A melting point tends to be higher as the amounts of units D and Q increase.

Component (A) can be obtained as a hydrolysis condensate of an organosilane represented by the following general formula (3),

wherein X is a halogen atom such as chlorine or an alkoxy group having 1 to 4 carbon atoms, and n is 1, 2, or 0. Here, X is preferably a halogen atom, particularly a chlorine atom, to obtain an organopolysiloxane in a solid state.

Examples of the silane compounds represented by the afore-mentioned formula (3) include methyltrichlorosilane, methyltrimethoxysilane, methyltriethoxysilane, dimethyldichlorosilane, dimethyldimethoxysilane, dimethyldiethoxysilane, tetrachlorosilane, tetramethoxysilane, and tetraethoxysilane.

Hydrolysis and condensation of the afore-mentioned silane compounds having a hydrolysable group can be carried out in any conventional method, for instance, in the presence of acid catalyst such as acetic acid, hydrochloric acid, and sulfuric acid or alkali catalyst such as sodium hydroxide, potassium hydroxide, and tetramethylammonium hydroxide. For instance, when use is made of a silane which has a chlorine atom as a hydrolysable group, water is added to generate hydrochloric acid as a catalyst so as to attain a hydrolysis condensate with a desired molecular weight.

The amount of water to be added in the hydrolysis and condensation is typically 0.9 to 1.6 moles, preferably 1.0 to 1.3 moles, relative to total 1 mole of the hydrolysable groups, such as a chlorine atom, in the afore-mentioned silane compound having a hydrolysable group. When this amount falls within the aforesaid range, the underfill composition exhibits excellent molding workability and the cured product exhibits excellent toughness.

The afore-mentioned silane compound having a hydrolysable group is hydrolyzed generally in an organic solvent such as alcohols, ketones, esters, cellosolves and aromatic compounds. Specific examples of the preferred solvents include alcohols such as methanol, ethanol, isopropyl alcohol, isobutyl alcohol, n-butanol and 2-butanol, and aromatic compounds such as toluene and xylene. A combination of isopropyl alcohol and toluene is more preferred for better curability of the composition and toughness of the cured product.

In this case, the temperature for the hydrolysis and condensation is preferably from 10 to 120 degrees C., more preferably from 20 to 100 degrees C. When the reaction temperature falls within the afore-mentioned range, a hydrolysis condensation product does not cause gelling and a solid hydrolysis condensate which is usable in the subsequent step is obtained.

When methyltrichlorosilane is used, water and isopropyl alcohol are added to methyltrichlorosilane dissolved in toluene to cause partial hydrolysis at a reaction temperature of from −5 degrees C. to 100 degrees C. Then, water is further added in such an amount that all of the unreacted chloro residues hydrolyze, and the resulting hydrolysate reacts with each other to give a solid silicone polymer with a melting point of 76 degrees C., represented by the following formula (4).

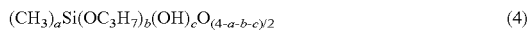

wherein a, b, and c are as defined above.

Examples of the compound represented by the afore-mentioned average compositional formula (4) include those represented by the following formula (5) or (6).

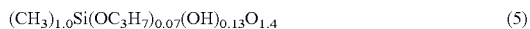

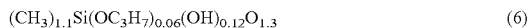

(B) Inorganic Filler

As the inorganic filler, any known inorganic filler can be used. Examples of the inorganic filler include fused silica, crystalline silica, titanium dioxide, alumina, boron nitride, aluminium nitride, silicon nitride; magnesium oxide, magnesium silicate and aluminium. Among these, preferred is at least one selected from fused silica, crystalline silica, titanium dioxide, magnesium oxide and alumina. Specifically, spherical fused silica is preferred because it gives a composition having a desirable lower viscosity. Also preferred is silica prepared by a sol-gel method or deflagration method.

Preferably, the inorganic filler is surface treated, in advance, with a coupling agent such as a silane coupling agent or titanate coupling agent to strengthen adhesion between the filler and the resin. Preferred coupling agents are, for example, epoxy functional alkoxy silanes such as γ-glycidoxypropyltrimethoxysilane, γ-glycidoxypropylmethyldiethoxysilane, and β-(3,4-epoxycyclohexyl)ethyl trimethoxysilane; amino functional alkoxy silanes such as N-β(aminoethyl)-γ-aminopropyltrimethoxysilane, γ-aminopropyltriethoxysilane, and N-phenyl-γ-aminopropyltrimethoxysilane; and mercapto functional alkoxy silane such as γ-mercaptopropyltrimethoxysilane. Among these, N-phenyl-γ-aminopropyltrimethoxysilane is preferred. An amount of the silane coupling agent and a method of surface treatment to be used are not limited to particular ones.

A particle size of the inorganic filler is preferably selected, depending on a gap size of a semiconductor device, i.e., a distance between a substrate and a semiconductor chip. For a typical device has a gap size ranging from 10 to 200 μm. The average particle size ranges preferably from 0.1 to 20 μm, more preferably from 0.5 to 10 μm in view of a viscosity of the underfill composition and a linear expansion coefficient of a cured product. If the particle size is smaller than the aforesaid lower limit, a viscosity of the composition is so high that the composition does not smoothly penetrate into the gap. On the other hand, if the particle size is larger than the aforesaid upper limit, the filler will interfere with penetration of the composition to leave an unfilled gap.

It is desirable to combine a filler with a fine particle size zone of 3 μm or less, a filler with a medium particle size zone of 4 to 8 μm, and a filler with a coarse particle size zone of 10 to 26 μm. Especially in a case where a composition is used as underfills in a gap having a narrow part, particularly desirable is an inorganic filler whose average particle diameter is one half or less of the size of the afore-said narrow part.

The inorganic filler preferably has such a particle size distribution that a fraction of particles having a particle size of one half the gap size or larger is not more than 0.1 wt %, particularly not more than 0.08 wt %, of the whole particles. Preferably, the inorganic filler has an average particle size, i.e., a median size ($d_{50}$), of about one-tenth of the gap size or smaller, and a maximum particle size, i.e., a particle size at 98 volume % in a cumulative particle size distribution ($d_{98}$), of one half the gap size or smaller. A particle size and its distribution can be measured by a laser diffraction method. An amount of the inorganic filler having a particle size larger than one half the gap size can be determined by (i) mixing the inorganic filler with pure water in a weight ratio of 1:9, (ii) ultrasonicating the mixture to break up agglomerates, (iii) filtering the mixture with a sieve having a mesh size of one half the gap size, and (iv) weighing a residue left on the sieve.

It has been found that a sol-gel method and a deflagration method are most suitable to control the particle size and its distribution. Spherical silica made by these methods is more a spherical than fused silica and has a controlled particle size distribution. The sol-gel method and the deflagration are well known in the art.

Preferably, 80 to 100 wt %, more preferably 90 to 100 wt %, most preferably 95 to 100 wt %, of the inorganic filler is the spherical silica made by the sol-gel method or the deflagration method. If the ratio is less than 80 wt %, fluidity of the composition may not be good.

The amount of the inorganic filler is from 250 to 1000 parts by weight, preferably from 300 to 950 parts by weight, relative to total 100 parts by weight of the components (A) and (D). If the amount is less than the afore-mentioned lower limit, the strength of the underfill composition may not be attained. If the amount exceeds the afore-mentioned upper limit, the viscosity increases so that an unfilled part remains, and mold filling defect may occur due to an increased flexibility after cured may be lost.

(C) Condensation Catalyst

Condensation catalyst (C) is used for curing the afore-mentioned component (A) and component (D), and selected, considering, for instance, storage stability of component (A) and component (D), and desired stiffness. Examples of the condensation catalysts include basic compounds such as trimethylbenzylammonium hydroxide, tetramethylammonium hydroxide, n-hexylamine, tributylamine, diazabicycloundecene (DBU) and dicyandiamide; metal compounds such as tetraisopropyl titanate, tetrabutyl titanate, titanium acetylacetonate, aluminum triisobutoxide, aluminum triisopropoxide, zirconium tetra(acetylacetonato), zirconium tetrabutylate, cobalt octylate, cobalt acetylacetonato, iron acetylacetonato, tin acetylacetonato, dibutyltin octylate, dibutyltin laurate, zinc octylate, zinc bezoate, zinc p-tert-butylbenzoate, zinc laurate, zinc stearate, aluminium phosphate, and aluminium triisopropoxide; organic titanium chelates such as aluminium trisacetylacetonate, aluminium bisethylacetoacetate.monoacetylacetonate, and diisopropoxybis(ethylacetoacetate)titanium. Among these, zinc octylate, zinc bezoate, zinc p-tert-butylbenzoate, zinc laurate, zinc stearate, aluminium phosphate, and aluminium triisopropoxide are preferred. Particularly, zinc benzoate and organic titanium chelates are preferred.

The amount of the curing catalyst is from 0.01 to 10 parts by weight, preferably from 0.1 to 6 parts by weight, relative to total 100 parts by weight of the components (A) and (D). Within the afore-mentioned range, curing proceeds good and storage stability of the composition is also good.

(D) Organopolysiloxane

Component (D) is an organopolysiloxane which is composed of unit $R_2SiO$ and unit $RSiO_{1.5}$, wherein R may be same or different and is a group selected from the group consisting of a hydroxyl group, a methyl group, an ethyl group, a propyl group, a cyclohexyl group, a phenyl group, a vinyl group and an allyl group, wherein at least a part of the afore-mentioned unit $R_2SiO$ repeats itself in series and the number of the repetition is 5 to 50, and wherein 0.5 to 10 mole % of all siloxane units comprising unit $R_2SiO$ and unit $RSiO_{1.5}$ has a silanol group.

Among these, organopolysiloxane which has a linear diorganopolysiloxane moiety represented by the following formula (2), is preferred.

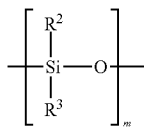
(2)

wherein R² and R³ are, independently of each other, selected from the group consisting of a hydroxyl group, an alkyl group having 1 to 3 carbon atoms, a cyclohexyl group, a vinyl group, a phenyl group and an allyl group, preferably a methyl group and a phenyl group. m is an integer of from 5 to 50, preferably from 8 to 30, more preferably 10 to 20. If m is less than the afore-mentioned lower limit, the cured product is poor in flexibility, i.e., crack resistance, and warpage of a device may occur. Meanwhile, if m exceeds the aforementioned upper limit, a mechanical strength tends to be lost.

In a molecule of component (D), unit $R_2SiO$ allows the polymer molecule to extend linear, and unit $RSiO_{1.5}$ makes the polymer molecule branched or three-dimensionally networked. Component (D) is preferably composed of unit D ($R_2SiO$), unit M ($R_3SiO_{0.5}$), and unit T ($RSiO_{1.5}$). The molar ratio among these is preferably 90 to 24:75 to 0:50 to 1, particularly 70 to 28:70 to 20:10 to 2 for good properties of the cured product, provided that the total is 100. Here, R is the group as defined above. Component (D) may comprise unit Q ($SiO_2$).

The weight average molecular weight of component (D), reduced to polystyrene, determined by gel permeation chromatography (GPC), is preferably from 3,000 to 1,000,000, more preferably from 10,000 to 100,000. When the molecular weight is within the afore-mentioned range, the polymer is solid or semi-solid and, therefore, is suitable for workability and curability.

Component (D) can be prepared by combining compounds which will constitute the afore-mentioned units in such a ratio that a desired mole ratio among the units is obtained in the resulting polymer, and carrying out hydrolysis and condensation in the presence of, for instance, an acid.

Examples of the raw materials for unit T ($RSiO_{1.5}$) include chlorosilanes such as $MeSiCl_3$, $EtSiCl_3$, $PhSiCl_3$, propyltrichlorosilane, and cyclohexyltrichlorosilane; and alkoxysilanes corresponding to the afore-mentioned chlorosilanes, such as methoxysilane.

Examples of the raw materials for unit R²R³SiO represented by the afore-mentioned formula (2) include

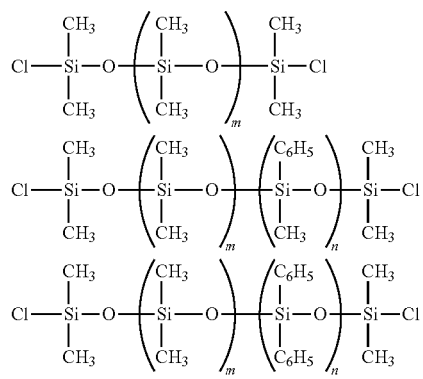

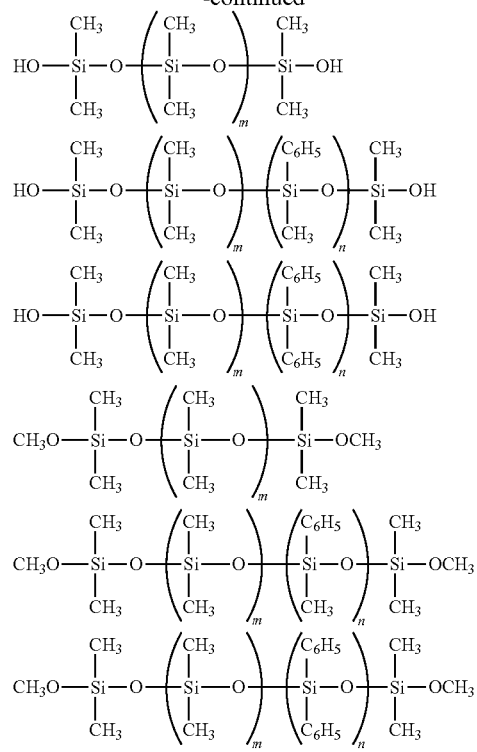

wherein m is the number of from 3 to 48 on average, n is the number of from 0 to 48 on average, provided that a total of m and n is the number of from 3 to 48 on average.

Examples of the raw materials for unit D ($R_2SiO$) and unit M ($R_3SiO_{0.5}$) include chlorosilanes such as $Me_2PhSiCl$, $Me_2ViSiCl$, $MePhSiCl_2$, $MeViSiCl_2$, $Ph_2MeSiCl$, $Ph_2ViSiCl$, and $PhViSiCl_2$; and alkoxysilanes corresponding to the afore-mentioned chlorosilanes such as methoxysilane, wherein Me represents a methyl group; Et represents an ethyl group; Ph represents a phenyl group, and Vi represents a vinyl group.

Component (D) can be obtained by combining the afore-mentioned raw materials in a particular mole ratio, and being reacted for instance, as follows. 100 Parts by weight of phenylmethyldichlorosilane, 2100 parts by weight of phenyltrichlorosilane, 2400 parts by weight of a silicone oil having 21 Si atoms and chlorodimethyl groups on both ends, and 3000 parts by weight of toluene are mixed. Then, the mixture of the silanes is added dropwise to 11000 parts by weight of water to hydrolyze at a temperature of from 30 to 50 degrees C. for 1 hour. After matured at 50 degrees C. for 1 hour, water is further added for washing and, subsequently, the organic phase is subjected to azeotropic dehydration, filtration, and stripping under reduced pressure.

Siloxane units having a silanol group may occur in the afore-mentioned hydrolysis and condensation step. Organopolysiloxane (D) preferably comprises the siloxane unit having a silanol group generally in a content of from 0.5 to 10 mole %, preferably from 1 to mole %, relative to the total moles of all of the siloxane units. Examples of the afore-mentioned siloxane unit having a silanol group include unit R(HO) $SiO_{2/2}$, unit $R(HO)_2SiO_{1/2}$, and unit $R_2(HO) SiO_{1/2}$, wherein R is not a hydroxyl group. Because organopolysiloxane (D) has a silanol group, it reacts with organopolysiloxane (A).

Preferably, from 1 to 40 parts by weight of component (D) is blended with from 60 to 99 parts by weight of component (A), provided that the total amount of component (A) and component (D) is 100 parts by weight. Preferably, the amount of the component (D) is from 2 to 50 parts by weight, more preferably from to 30 parts by weight, relative to 100 parts by weight of the components (A). If the amount is less than the afore-mentioned lower limit, the moldability is worse and cracks may occur. If the amount exceeds the afore-mentioned upper limit, the viscosity of the composition is so high that molding may be difficult.

(E) Silane Coupling Agent

The present underfill composition may comprise a coupling agent such as mercapto-functional alkoxy silanes such as γ-mercaptopropyltrimethoxysilane; and γ-glycidoxypropyltrimethoxysilane, γ-glycidoxypropylmethyldiethoxysilane, and β-(3,4-epoxycyclohexyl)ethyl trimethoxysilane. Among these, γ-mercaptopropyltrimethoxysilane is preferred for increasing the adhesiveness of the underfill composition to a gold bump. The amount of the silane coupling agent is from 0.2 to 2.0 parts by weight, more preferably from 0.2 to 1.5 parts by weight, relative to total 100 parts by weight of the components (A) and component (D). If the amount is less than the afore-mentioned lower limit, adhesiveness to a gold bump may be poor. If the amount is more than the afore-mentioned upper limit, storage stability may be worse.

(F) Other Additives

The present underfill composition may comprise additives such as whiskers, silicone powder, thermoplastic resins, thermoplastic elastomers, and organic synthetic rubber; internal releasing agents such as esters of aliphatic acids, esters of glyceric acid, zinc stearate, and calcium stearate; and antioxidants of a phenol type, phosphorus type, and sulfur type, in such an amount that the effects of the present invention are not damaged. It should be noted that the present composition shows less discoloration by light, even without any antioxidant, compared to conventional underfill compositions.

Preparation of the Underfill Composition

The underfill composition can be prepared by mixing, melting, and dispersing the aforesaid components (A) to (E) and optional components, if desired, altogether or sequentially while heating, if necessary. Any apparatus can be used, such as a mixing and grinding machine equipped with a stirring means and a heater, a three-roll mill, a ball mill, and a planetary mixer.

The present optical semiconductor device can be prepared as follows: (i) an optical semiconductor element such as LED is attached to a substrate via a gold bump, (ii) the aforesaid underfill composition is poured and filled into a gap between the optical semiconductor element and the substrate, and (iii) the composition is cured. The curing conditions may be, for example, a temperature of 140 to 200 degrees C. for 0.5 to 10 hours, but not limited to these.

The underfill composition of the present invention thus obtained has good moldability and heat and light resistances, particularly against ultraviolet ray and, therefore, is suitable as an underfill composition for white, blue, or, further, ultraviolet LED.

EXAMPLES

The present invention will be explained more in detail in the following Examples and Comparative Examples. However, the present invention shall not be limited to the Examples.

Preparation of Underfill Compositions

The underfill compositions were prepared by kneading the components in the formulations shown in Table 1 with a three-roller mill.

The details of the materials indicated in Table 1 are as follows.

Organopolysiloxane (A)

Synthesis Example

To a one-litter flask were added 100 grams of methyltrichlorosilane and 200 grams of toluene. To the resulting mixture, was added dropwise a mixture of 8 grams of water and 60 grams of isopropyl alcohol over to 20 hours while keeping the inner temperature at minus 5 to 0 degrees C. in an ice bath. Then, the mixture was heated at a refluxing temperature for 20 minutes with stirring, and cooled to room temperature, to which 12 grams of water were added dropwise at an inner temperature below 30 degrees C. over 30 minutes and the mixture was stirred for 20 minutes. Further, 25 grams of water were added dropwise and stirred at a temperature of 40 to 45 degrees C. for 60 minutes. Then, 200 grams of water were added and an organic phase was separated. The organic phase was washed until the phase became neutral and then subjected to azeotropic dehydration, filtration, and stripping under reduced pressure to obtain 36.0 grams of a colorless and transparent solid (melting point, 76 degrees C.), which is organopolysiloxane (A) represented by the following formula (7). The weight average molecular weight is 2800, reduced to polystyrene.

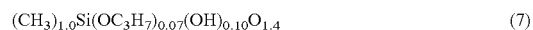

$$(CH_3)_{1.0}Si(OC_3H_7)_{0.07}(OH)_{0.10}O_{1.4} \qquad (7)$$

(B) Inorganic Filler

Spherical fused silica, LVS-516 (ex Tatsumori Co., Ltd), average particle diameter of 0.7 μm Spherical fused silica, MSR-4500TN (ex Tatsumori Co., Ltd), average particle diameter of 45 μm In Examples 1 to 3 and Comparative Examples 1 to 4, 100 grams of the aforesaid spherical fused silica and 0.3 grams of N-phenyl-γ-aminopropyltrimethoxysilane were dry stirred to mature to prepare the surface treated inorganic filler. In Example 4, non-treated inorganic filler was used.

(C) Condensation Catalyst

Zinc benzoate (ex Wako Pure Chemical Industries Ltd.)

(D) Organopolysiloxane

Synthesis Example

100 Grams of phenylmethyldichlorosilane, 2100 grams of phenyltrichlorosilane, 2400 grams of silicone oil having 21 Si atoms and chlorodimethyl groups on both ends and 3000 grams of toluene were mixed. The resulting mixture was added dropwise to 11000 grams of water, and hydrolyzed at a temperature of 30 to 50 degrees C. for 1 hour. Then, the mixture was matured at 50 degrees C. for 1 hour, to which water was added for washing. Then, the organic phase was subjected to azeotropic dehydration, filtration, and stripping under reduced pressure to obtain colorless and transparent organopolysiloxane (D) which had a melt viscosity of 5 Pa·s at 150 degrees C.

(E) Silane Coupling Agent

γ-mercaptopropyltrimethoxysilane: KBM803 (ex Shin-Etsu Chemical Co., Ltd.)

(F) Additive

Release agent: Calcium stearate (ex Wako Pure Chemical Industries, Ltd.)

Examples 1 to 4 and Comparative Examples 1 to 3

In the formulations shown in Table 1, organopolysiloxane (A), inorganic filler (B), condensation catalyst (C), organopolysiloxane (D), silane coupling agent (E) and additive (F) were blended and mixed by rolls, cooled and pulverized to obtain underfill compositions.

Comparative Example 4

The procedures of Example 1 were repeated except that an epoxy resin, NC-3000 (ex Nihon Kayaku Co., Ltd.) and a phenol resin, MEH-7851SS (ex Meiwa Kasei Co.) were used in place of the aforesaid components (A) and (D), and triphenylphosphine was used as condensation catalyst (C).

The following properties were determined on these compositions. The results are as shown in Table 1. All of the compositions were molded using a transfer molding machine at a molding temperature of 175 degrees C. and with a molding time of 180 seconds.

Spiral Flow Value

Using a mold according to the Epoxy Molding Materials Institute (EMMI) Standards, a spiral flow value was determined at a molding temperature of 175 degrees C. and a molding pressure of 6.9 N/mm$^2$ with a molding time of 180 seconds.

High Temperature Hardness Test

A stick having a size of 5 mm×10 mm×100 mm was molded at a molding temperature of 175 degrees C. and a molding pressure of 6.9 N/mm$^2$ with a molding time of 180 seconds, and was subjected to the determination of the hardness.

Penetration

The resin composition was dropped at a gap of the flip-chip semiconductor package which has a gap size of 40 μm to allow to penetrate, cured at 175 degrees C., and was subjected to the determination of the penetration.

Light Resistant Test

A cured disc with a diameter of 50 mm and a thickness of 3 mm was molded at a molding temperature of 175 degrees C. and a molding pressure of 6.9 N/mm$^2$ with a molding time of 180 seconds. The cured disc was irradiated with ultraviolet at the 60 mW/cm with a high-pressure mercury vapor lamp having 365 nm peak wavelength for 100 hours, and was subjected to the observation of the appearance.

Adhesion Test

On an Au frame substrate of a size of 20×20 mm, the afore-mentioned underfill composition was molded at 175 degrees C. and 6.9 N/mm$^2$ with a molding time of 180 seconds to prepare a trapezoidal test piece. The adhesion strength (MPa) of each test piece was determined by pulling the test piece at a velocity of around 0.2 millimeters per second by the versatile bond tester, DAGE SERIES 4000, at room temperature.

TABLE 1

| | Component, parts by weight | | Examples | | | | Comparative Examples | | | |
|---|---|---|---|---|---|---|---|---|---|---|
| | | | 1 | 2 | 3 | 4 | 1 | 2 | 3 | 4 |
| (A) | Organopolysiloxane | | 95 | 90 | 85 | 90 | 90 | 90 | 90 | |
| | Epoxy resin | NC-3000 | | | | | | | | 57 |
| | Phenol resin | MEH-7851SS | | | | | | | | 43 |
| (B)-1 | Inorganic filler | LVS-516 | 420 | 420 | 420 | 420 | 420 | 420 | | 420 |
| (B)-2 | Inorganic filler | MSR-4500TN | | | | | | | 420 | |
| | Surface teatment of the filler | | treated | treated | treated | non-treated | treated | treated | treated | treated |
| (C)-1 | Condensation catalyst | Zinc benzoate | 1 | 1 | 1 | 1 | 1 | 1 | 1 | |
| (C)-2 | Condensation catalyst | TPP | | | | | | | | 1 |
| (D) | Organopolysiloxane | | 5 | 10 | 15 | 10 | 10 | 10 | 10 | |
| (E) | γ-mercaptopropyltrimethoxysilane | | 0.5 | 0.5 | 0.5 | 0.5 | 0.1 | | 0.5 | 0.5 |
| (F) | Calcium stearate | | 2 | 2 | 2 | 2 | 2 | 2 | 2 | 2 |
| Evaluation of properties | Spiral Flow Value, inch | | 28 | 30 | 25 | 23 | 27 | 43 | 62 | 72 |
| | High Temperature Hardness Test at 175° C./180 s | | 18 | 23 | 33 | 19 | 16 | 15 | 0 | 83 |
| | Penetration | | filled | filled | filled | filled | filled | filled | unfilled | filled |
| | Light Resistant Test | | no change | no change | no change | no change | no change | no change | no change | turned yellow |
| | Adhesion Test, MPa | | 3.5 | 3.4 | 3.3 | 3.6 | 0.8 | X | 3.5 | 3.4 |

As seen in Table 1, the adhesion to the gold plate was poor in Comparative Example 1 where the content of component (E) was too low, and in Comparative Example 2 where component (E) was not contained at all. The light resistance was bad and the cured product was turned yellow in Comparative Example 4 where the epoxy resin and the phenol resin which are widely used as an underfill composition was used. Further, the underfill composition was not filled into the narrow gap in Comparative Example 3 where inorganic filler having a large average particle diameter was used. Contrary to these, Examples 1 to 4 of the present invention showed the excellent light resistance and adhesion to the gold plate, and the good penetration into the narrow gap.

INDUSTRIAL APPLICABILITY OF THE INVENTION

The present resin composition is suitable for use in optical semiconductor devices which is formed by attaching an optical semiconductor element to the substrate via a gold bump.

The invention claimed is:

1. An underfill composition for filling a gap, said gap ranging in size from 10 to 200 μm, between a substrate and an optical semiconductor element to thereby form an optical semiconductor device, said composition comprising
(A) 60 to 99 parts by weight of a branched organopolysiloxane having a weight average molecular weight of from 500 to 20000, reduced to polystyrene, and represented by the following average compositional formula (1), $$(CH_3)_a Si(OR_1)_b (OH)_c O_{(4-a-b-c)/2} \tag{1}$$

wherein R1 is an organic group having 1 to 4 carbon atoms and a, b, and c are numbers satisfying the equations:

$$0.8 <= a <= 1.5,$$

$$0 <= b <= 0.3,$$

$$0.001 <= c <= 0.5, \text{ and}$$

$$0.801 <= a+b+c < 2,$$

(B) 250 to 1000 parts by weight of an inorganic filler, wherein not more than 0.1 weight-% of the particles of said inorganic filler have a particle size that is greater than or equal to half the size of said gap,
(C) 0.01 to 10 parts by weight of a condensation catalyst,
(D) 1 to 40 parts by weight of an organopolysiloxane comprising $R_2SiO$ units and $RSiO_{1.5}$ units wherein R is, independently of each other, a group selected from the group consisting of hydroxyl groups, methyl groups, ethyl groups, propyl groups, cyclohexyl groups, phenyl groups, vinyl groups, and allyl groups, provided that at least a portion of the $R_2SiO$ units are a linear diorganopolysiloxane moiety represented by the following formula (2),

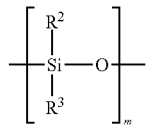

wherein R2 and R3 are, independently of each other, selected from the group consisting of a hydroxyl group, alkyl groups having 1 to 3 carbon atoms, a cyclohexyl group, a vinyl group, a phenyl group and an allyl group, and m is an integer of from 5 to 50, and
(E) 0.2 to 2.0 parts by weight of a silane coupling agent
provided that a total amount of component (A) and component (D) in said composition is 100 parts by weight.

2. The underfill composition according to claim 1, wherein the inorganic filler (B) is at least one selected from the group consisting of fused silica, crystalline silica, titanium dioxide, magnesium oxide and alumina, and has an average particle size in a range of from 0.1 to 20.0 μm, and wherein an amount of the inorganic filler (B) is from 70 to 93% by weight, relative to the underfill composition.

3. The underfill composition according to claim 1, wherein the inorganic filler (B) is surface-treated with a silane coupling agent.

4. The underfill composition according to claim 3, wherein the inorganic filler (B) is surface-treated with N-phenyl-γ-aminopropyltrimethoxysilane.

5. The underfill composition according to claim 1, wherein the silane coupling agent (E) is γ-mercaptopropyltrimethoxysilane.

6. An optical semiconductor device equipped with a cured product from the underfill composition described in claim 1.

7. The underfill composition according to any one of claims 1 to 5, wherein the organopolysiloxane (D) further comprises unit $R_3SiO_{0.5}$ and the molar ratio among unit $R_2SiO$, unit $R_3SiO_{0.5}$, and unit $RSiO_{1.5}$ is 90 to 24:75 to 0:50 to 1, provided that the total is 100.

* * * * *